United States Patent
Eto et al.

(10) Patent No.: US 6,339,345 B1
(45) Date of Patent: Jan. 15, 2002

(54) SEMICONDUCTOR DEVICE EQUIPPED WITH OUTPUT CIRCUIT ADJUSTING DURATION OF HIGH AND LOW LEVELS

(75) Inventors: Satoshi Eto; Hironobu Akita; Katsuaki Isobe, all of Kanagawa (JP)

(73) Assignees: Fujitsu Limited, Kawasaki; Kabushiki Kaisha Toshiba, Kanagawa-ken, both of (JP)

( * ) Notice: Subject to any disclaimer, the term of this patent is extended or adjusted under 35 U.S.C. 154(b) by 0 days.

(21) Appl. No.: 09/696,048

(22) Filed: Oct. 26, 2000

(30) Foreign Application Priority Data

Oct. 28, 1999 (JP) ............................................ 11-306265

(51) Int. Cl.$^7$ ................................................ H03L 7/00
(52) U.S. Cl. ......................... 326/83; 326/95; 327/141; 327/218
(58) Field of Search ............................. 326/83, 95, 98, 326/46; 327/141, 218, 199, 200

(56) References Cited

U.S. PATENT DOCUMENTS 5,254,883 A * 10/1993 Horowitz et al. ............. 326/30
6,034,555 A * 3/2000 Taguchi et al. ............... 327/53

* cited by examiner

Primary Examiner—Michael Tokar
Assistant Examiner—Daniel D. Chang
(74) Attorney, Agent, or Firm—Arent Fox Kintner Plotkin & Kahn, PLLC

(57) ABSTRACT

In an output circuit 10, a latch circuit 11, a phase difference controlled circuit 12 and an output buffer circuit 13 are cascaded and a DATA is clocked into the latch circuit 11. A replica circuit 20 is a down-scaled version of a layout pattern of the output circuit 10, comprises circuits 21 to 23 corresponding to the circuits 11, 12 and 13, and a CLK is provided through a delay circuit 5 and a divide-by-2 frequency divider 16 to the data input of the latch circuit 21 as a data. The output of the replica circuit 20 is provided through a dummy load circuit 24 and a low pass filter 25 to a comparator 26, the output thereof is compared with a reference voltage Vref to generate count-up or count-down pulses. The pulses are counted by an up-down counter 27 whose count is provided to the phase difference controlled circuit 12 and its replica 22 to reduce the phase difference between rising and falling edges of the output signal of the output buffer circuit 23.

12 Claims, 11 Drawing Sheets

US 6,339,345 B1

SEMICONDUCTOR DEVICE EQUIPPED WITH OUTPUT CIRCUIT ADJUSTING DURATION OF HIGH AND LOW LEVELS

BACKGROUND OF THE INVENTION

1. Field of the Invention

The present invention relates to a semiconductor device equipped with an output circuit for latching data in response to a clock and enhancing the driving power of output data signal.

2. Description of the Related Art

FIG. 11(A) is a time chart showing a relation between DATA and a clock CLK, wherein the data is one outputted from an output circuit built in a semiconductor device of this type, for example DRAM. In a circuit receiving the DATA, since the DATA is held in response to an edge of the clock CLK, the DATA has to be definite on the edge.

An indefinite-data time B increases while a definite-data time A=T−B, wherein T represents a cycle time of the clock CLK, decreases due to variations in process, temperature and power supply voltage of the semiconductor device. For example, in a case of the clock CLK being 100 MHZ, since T is as short as T=10 ns, the indefinite-data time is necessary to be shorter in order to increase a clock frequency.

As shown in FIG. 11(B), if there is a phase difference φ between rising and falling edges of data signal relative to an edge of the clock CLK because of the above described causes, there arise a difference between duration's of high and low levels, resulting in extending the indefinite-data time.

In the prior art, an output circuit was adjusted such that the phase difference φ was made smaller prior to shipment of a product (a semiconductor device).

However, since there are variations in temperature and power supply voltage in operation of respective products built in electronic equipment, there has been a problem that the indefinite-data time B becomes longer with increase in the phase difference φ.

SUMMARY OF THE INVENTION

Accordingly, it is an object of the present invention to provide a semiconductor device which enables to shorten an indefinite-data time by automatically decreasing a phase difference between rising and falling edges of data signal relative to a clock edge.

In one aspect of the present invention, there is provided a semiconductor device comprising: an output circuit, having a clock input to receive a clock, having a data input to receive an input data, having a data output providing the input data as an output data in response to the clock, having a control input to receive a control signal for adjusting an output timing of the output data; a replica circuit of the output circuit, having a clock input to receive the clock, having a data input to receive a cyclically inverted input dummy data, the input dummy data being in synchronism with the clock, having a data output providing the dummy data as an output dummy data in response to the clock, having a control input to receive the control signal for adjusting an output timing of the output dummy data; a dummy load circuit, receiving the output dummy data; and a control circuit, providing the control signal to make high and low level duration of the output dummy data provided from the dummy load circuit become equal to each other.

With this aspect, high and low level duration of the output of the replica circuit becomes almost equal to each other independently of variations in fabrication process parameters, temperature or power supply voltage of the semiconductor device, so that the indefinite-data time of the output of the output circuit is prevented from being longer. Therefore, the clock can be faster.

Other aspects, objects, and the advantages of the present invention will become apparent from the following detailed description taken in connection with the accompanying drawings.

DESCRIPTION OF THE PREFERRED EMBODIMENTS

Figure 1:
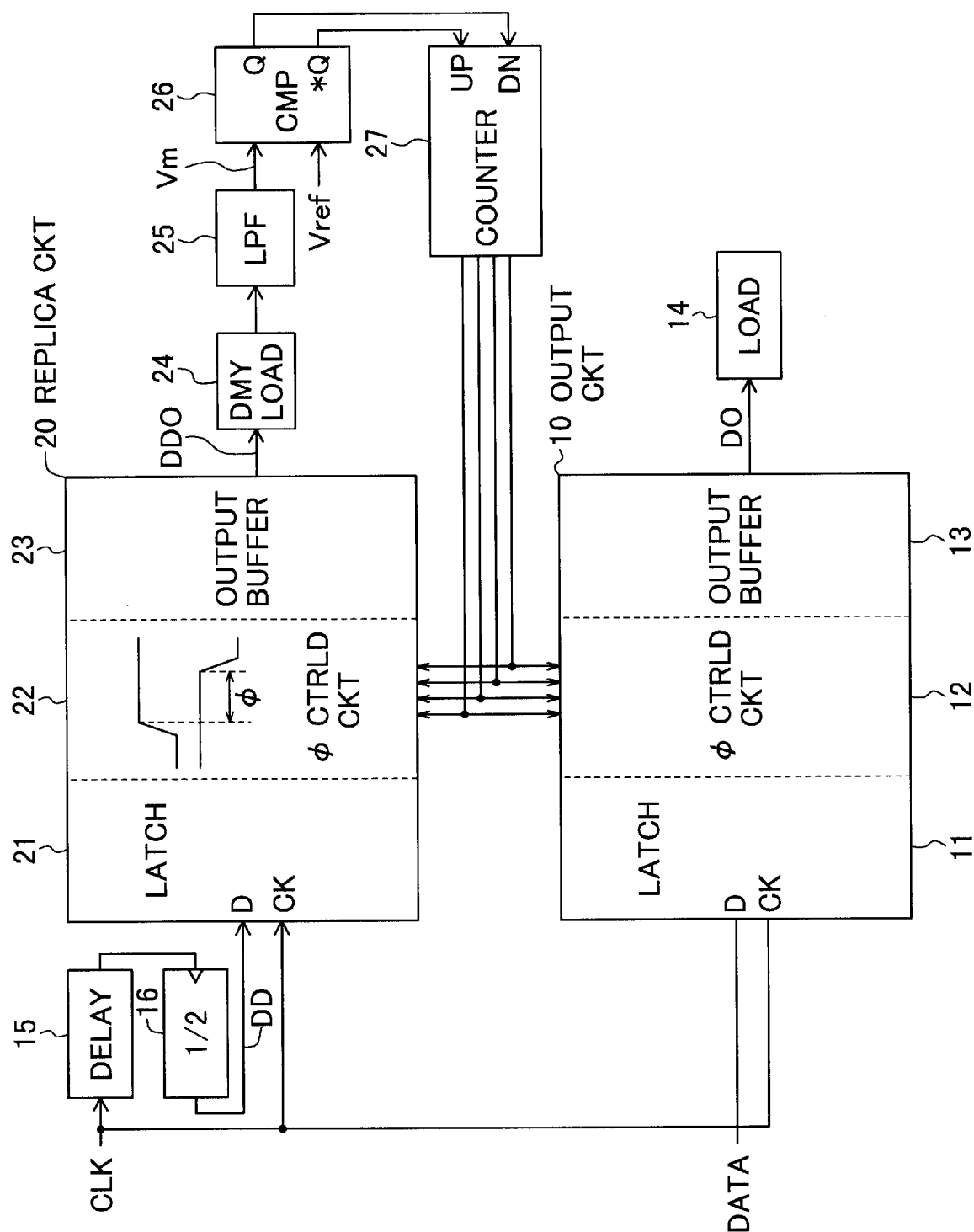
FIG. 1 is a schematic circuit diagram showing configurations of an output circuit and a circuit for automatically decreasing the phase difference between rising and falling edges of the output data signal of the output circuit built in a semiconductor device, of a first embodiment according to the present invention.

Referring now to the drawings, wherein like reference characters designate like or corresponding parts throughout several views, preferred embodiments of the present invention are described below. A signal which is active low will be denoted with adding * to a reference character.

First Embodiment

FIG. 1 shows schematic configurations of an output circuit 10 and a circuit for automatically decreasing the phase difference between rising and falling edges of the output data signal of the output circuit 10 in a semiconductor device, for example DRAM, of the first embodiment according to the present invention.

The output circuit 10 comprises a latch circuit 11 having a data signal input D and a clock input CK, wherein a DATA signal provided to the data signal input D is latched on a rising edge of a clock CLK provided to the clock input CK, a phase difference controlled circuit 12 having control inputs for controlling a phase difference between rising and falling edges of an output of the circuit 11, and an output buffer circuit 13 for converting a level of the controlled data signal according to an input interface specification of a data receiving side device and for enhancing a driving power of an output signal. The transistor size of the output buffer circuit 13 is larger than those of the latch circuit 11 and the phase difference controlled circuit 12.

The data signal output of the output circuit 10 is connected to a data signal input of the data receiving side device, for example a microprocessor, and in FIG. 1, an output load to the output circuit 10 in this connection state is represented by a box 14.

A replica circuit 20 serves as a monitor for operation of the output circuit 10 in simulation and has a scaled down configuration of a layout pattern of the output circuit 10 in order to make reduction in power consumption. The replica circuit 20 comprises a latch circuit 21, a phase difference controlled circuit 22 and an output buffer circuit 23 corresponding to the circuits 11, 12 and 13, respectively, of the output circuit 10. To the data signal input D of the latch circuit 21A, a dummy data signal DD whose logic level is inverted in each cycle of the clock CLK is provided. The dummy data signal DD is generated by providing the clock CLK to a divid-by-2 frequency divider 16 through a delay circuit 15.

Corresponding to the load 14A, a dummy load 24 is connected to the output of the replica circuit 20. The output of the dummy load 24 is smoothed through a low pass filter 25 and provided to a first input of a comparator 26 as an average voltage Vm. To the second input of the comparator 26, a reference voltage Vref, which is the desired average (VH+VL)/2 of the high and low levels VH and VL, is provided. The non-inverted output Q of the comparator 26 is high when Vm>Vref, and low when Vm<Vref.

The non-inverted output Q and the inverted output *Q of the comparator 26 are connected to the down-signal input DN and the up-signal input UP, respectively, of a counter 27. The counter 27 counts up pulses provided to the up-signal input UP and counts down pulses provided to the down-signal input DN. The count of the counter 27 is provided to the control inputs of the phase difference controlled circuits 12 and 22.

Figure 2:
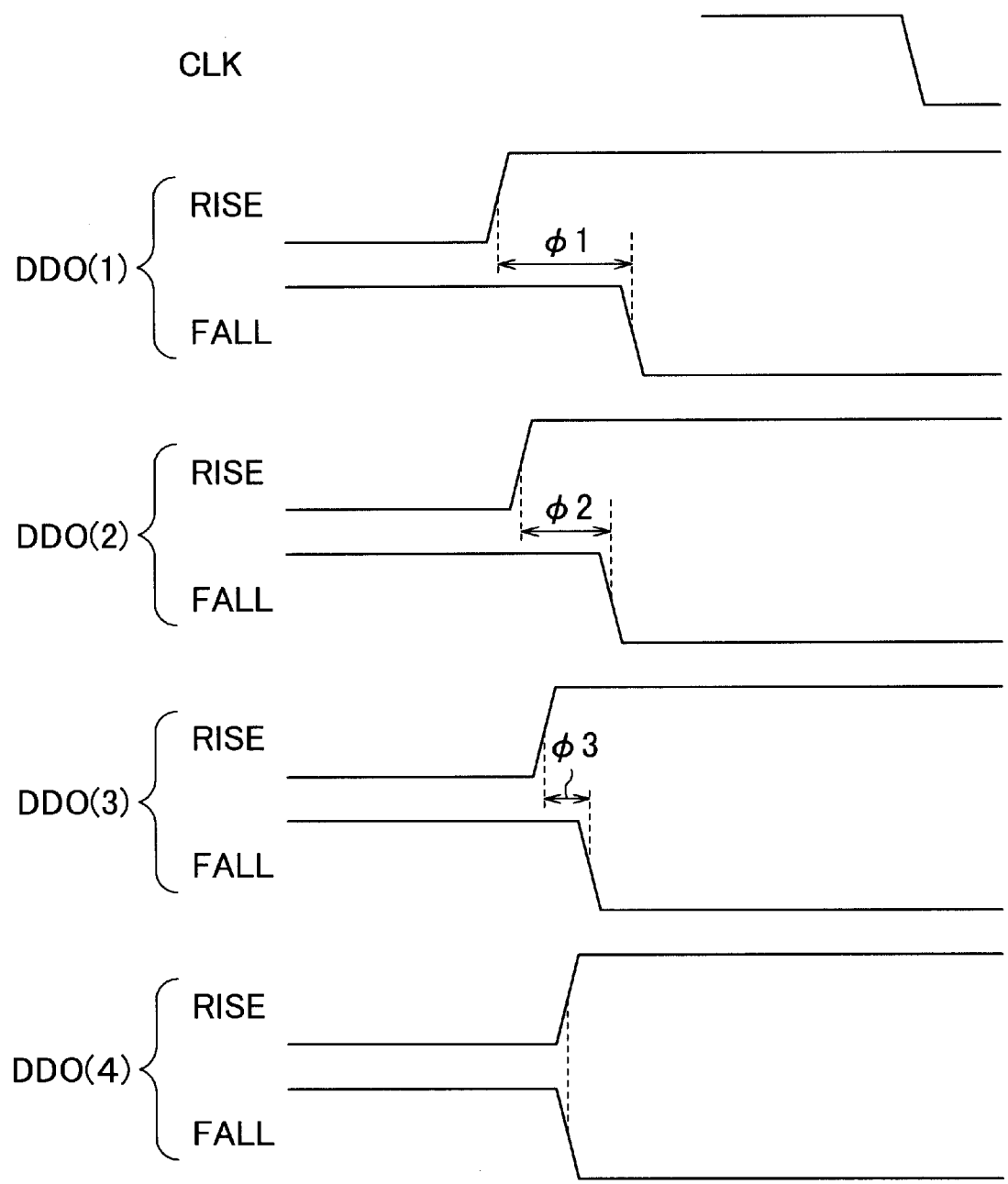
FIG. 2 is an illustration showing changes in phases of rising and falling edges of a dummy output data signal DDO relative to that of a clock in automatic phase different control.
Figure 3A:
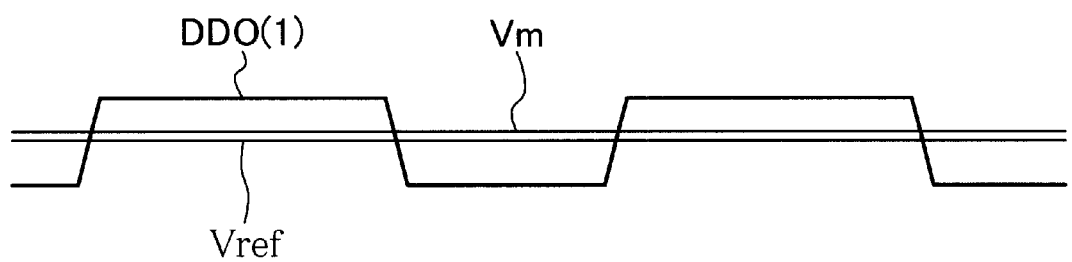
FIGS. 3(A) and 3(B) are waveform diagrams of the dummy output data signal DDO drawn together with an average voltage Vm thereof and a reference voltage Vref.
Figure 3B:
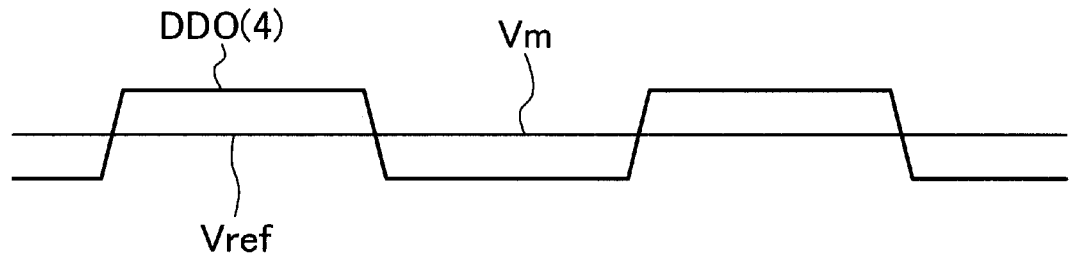

Then, with reference to FIGS. 2 and 3, operations of the circuit of FIG. 1 configured as described above will be described. FIG. 2 shows changes in phases of rising and falling edges of the dummy output data signal DDO relative to a falling edge of the clock CLK in automatic phase difference control. In a case of DDO(1), since a rising edge is earlier than a falling edge, as shown in FIG. 3(A), a waveform of the dummy output data signal DDO(1) is such that a high level duration is longer than a low level duration. Then, Vm>Vref holds and the counter 27 counts down pulses of the down-signal input DN. Thereby, in the phase difference controlled circuits 12 and 22, the phase difference φ is controlled so as to decrease and the dummy output data signal DDO changes from a state of DDO(1) to a state of DDO(2) and further to a state of DDO(3) of FIG. 2. Furthermore, when a state of DDO(4) is established, the up-signal input UP and the down-signal input DN go high alternately, so that the count of the counter 27 shows an almost constant value. In this state, a waveform of the dummy output data signal DDO has high and low level duration equal to each other as shown in FIG. 3(B).

Figure 4:
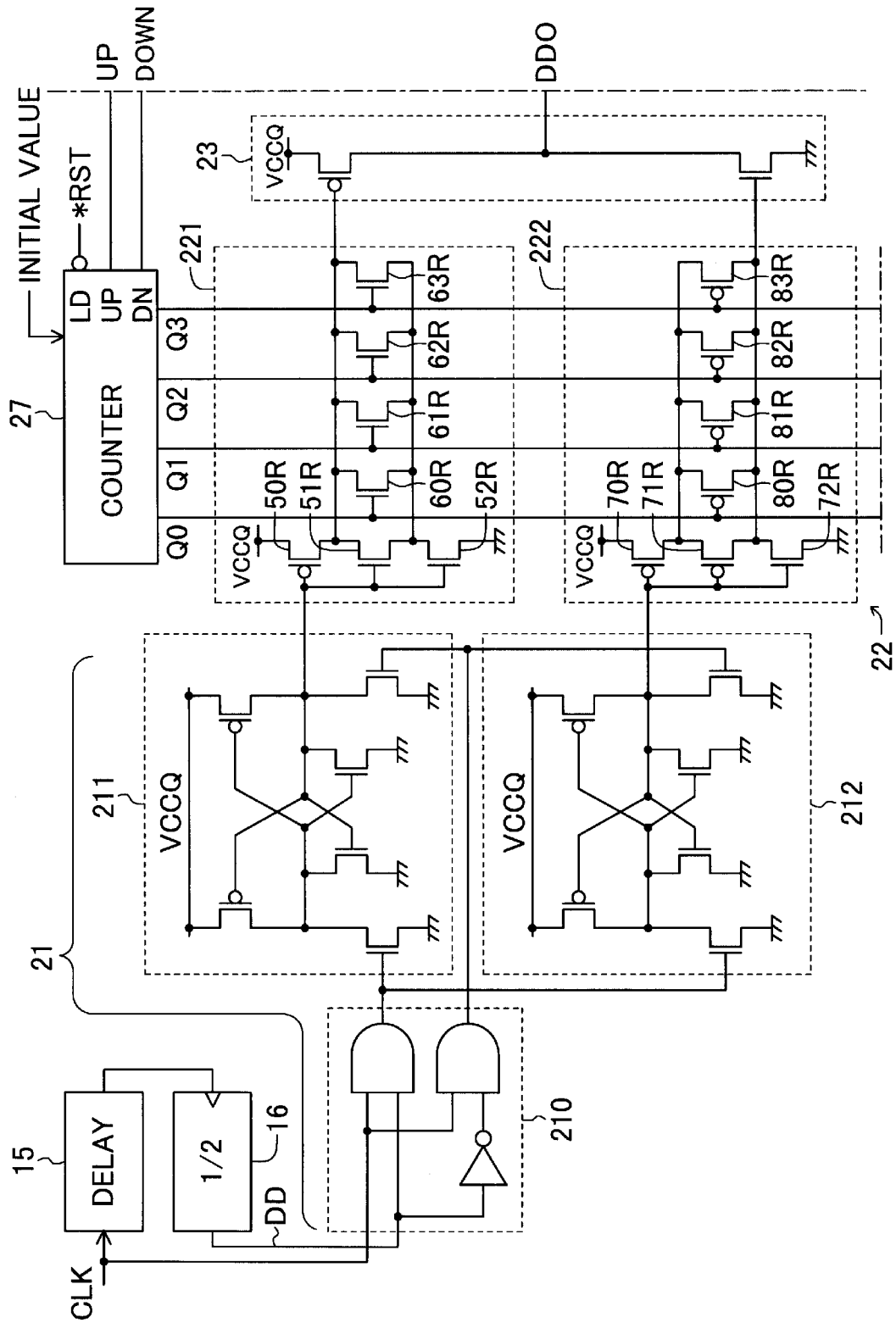
FIG. 4 is a circuit diagram showing an embodiment of part of FIG. 1.
Figure 5:
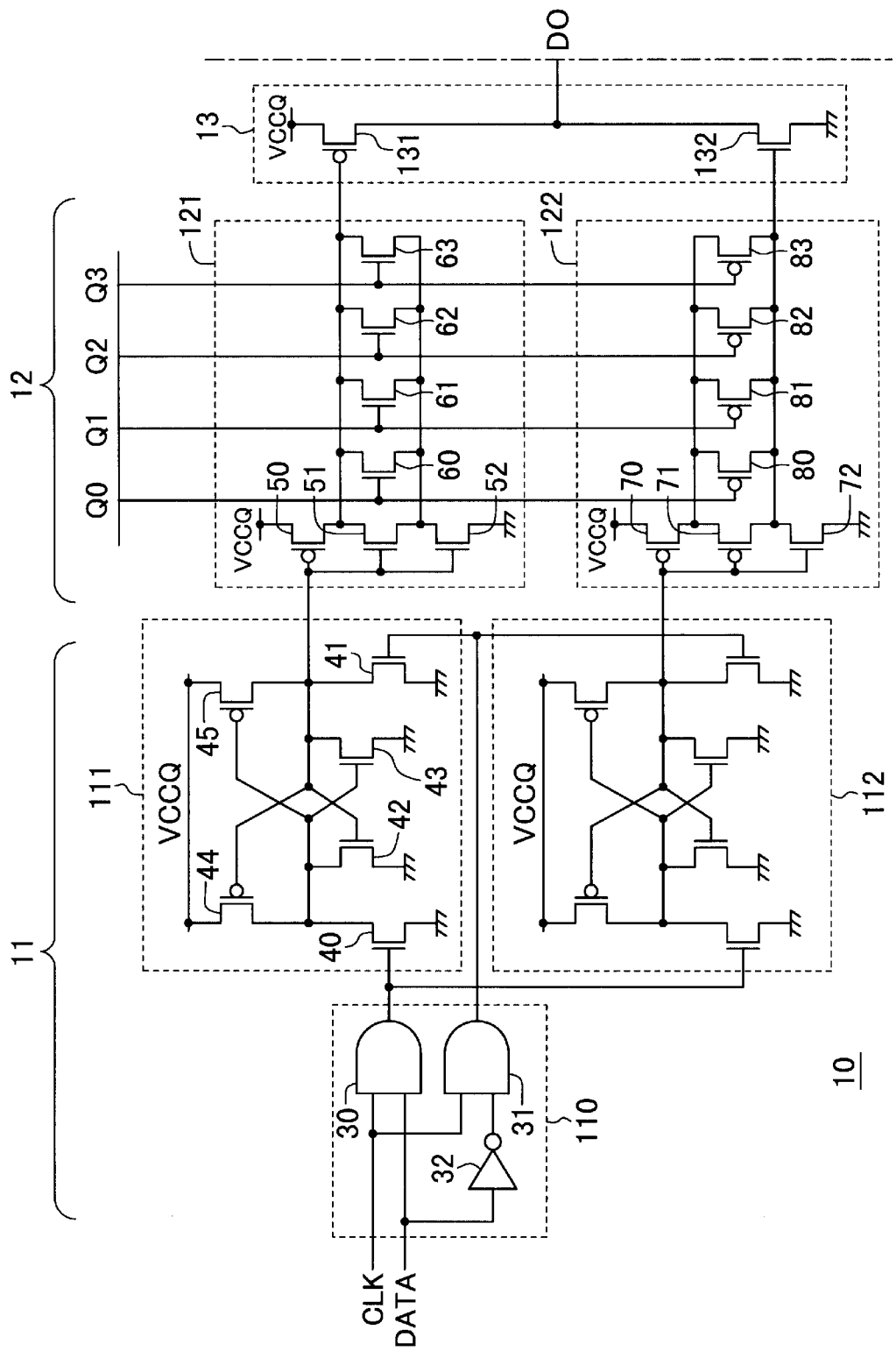
FIG. 5 is a circuit diagram showing an embodiment of another part of FIG. 1.
Figure 6:
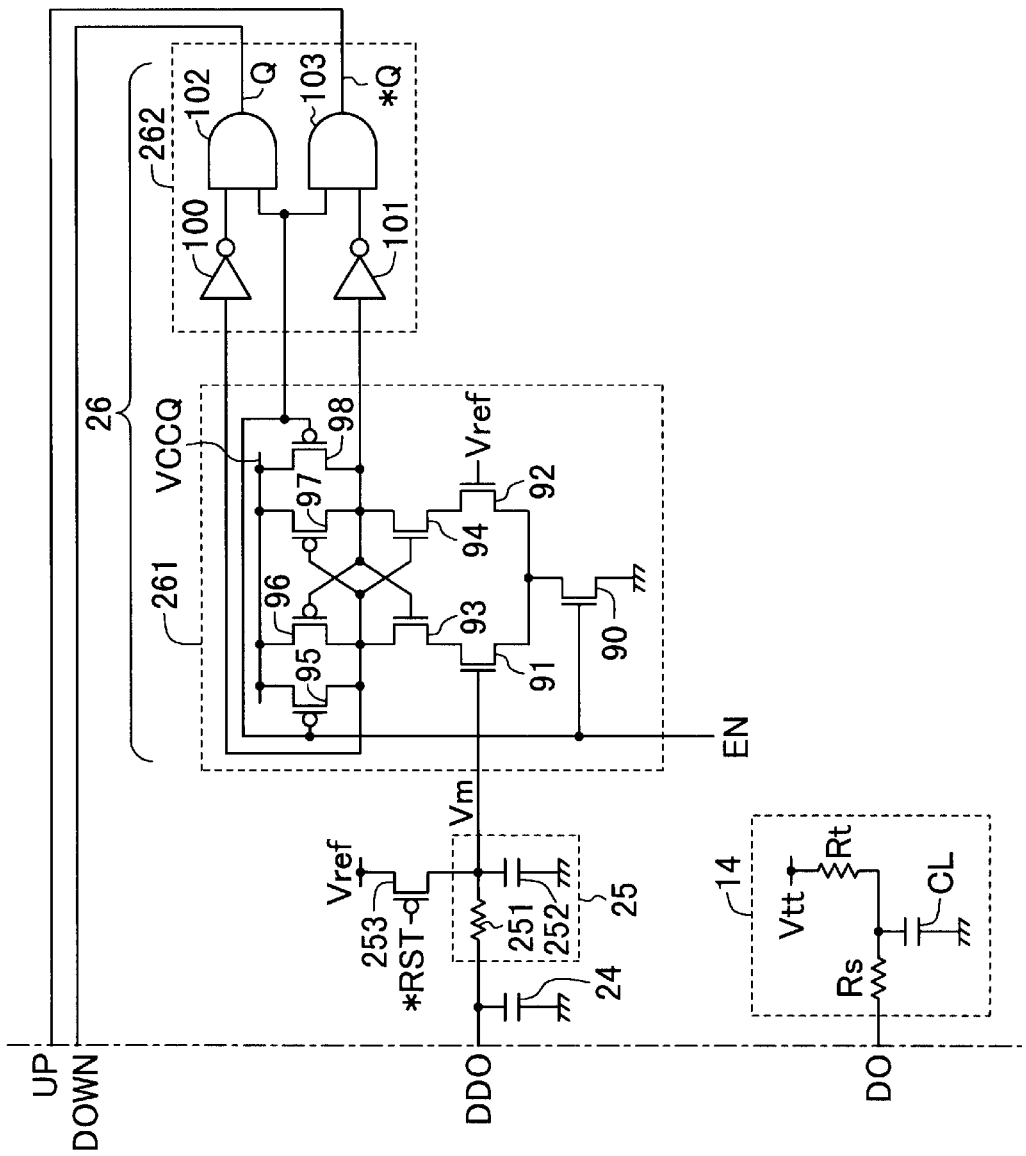
FIG. 6 is a circuit diagram showing an embodiment of the rest of FIG. 1.

FIGS. 4 to 6 shows an embodiment of respective three parts of FIG. 1.

An internal power supply voltage Vii, for example 1.8 V, is supplied to the delay circuit 15, the divid-by-2 frequency divider 16 and a gate circuit 210 of FIG. 4 and a gate circuit 110 of FIG. 5, while a power supply voltage VCCQ, for example 2.5 V, is supplied to the other circuits.

As shown in FIG. 5, the latch circuit 11 comprises the gate circuit 110, and level shift & latch circuits 111 and 112 with the same configuration as each other.

In the gate circuit 110, the clock CLK is provided to first inputs of AND gates 30 and 31, and the DATA and its inverted signal through an inverter 32 are provided to the second inputs of the AND gates 30 and 31, respectively. Therefore, during a time when the clock CLK is high, the outputs Q and Q* of the AND gates 30 and 31 coincide with the DATA and its complement, respectively, and during a time when the clock CLK is low, the both outputs are low.

The level shift & latch circuit 111 comprises NMOS transistors 40 to 43, and PMOS transistors 44 and 45, wherein a flip-flop is constructed of the transistors 44, 45, 42 and 43. The outputs 30 and 31 of the AND gates are provided to the gates of the transistors 40 and 41, respectively.

When the clock CLK and the DATA are both high, the transistors 40 and 41 are both on and off, respectively. Thereby, the transistor 45 is on, the output of the level shift & latch circuit 111 is high, and the transistors 43, 44 and 42 are on, off and on, respectively. When the clock CLK goes low from this state, although the transistor 40 is turned off, the output of the level shift & latch circuit 111 maintains high.

When the clock CLK is high and the DATA is low, the on and off states of the transistors are reverse to the above described state, and the output of the level shift & latch circuit 111 is low. When the clock CLK goes low from this state, although the transistor 41 is turned off, the output of the level shift & latch circuit 111 maintains low.

That is, the level shift & latch circuit 111 is in a through state while the clock CLK is kept high, and the DATA on falling of the clock CLK is held during the clock CLK is low.

The level shift & latch circuit 112 operates in the same way as the level shift & latch circuit 111 does.

The phase difference controlled circuit 12 comprises an inverter 121 which inverts the output of the level shift & latch circuit 111 and can control a phase on falling edge of the inverted signal, and an inverter 122 which inverts the output of the level shift & latch circuit 112 and can control a phase on rising edge of the inverted signal.

The fall phase variable inverter 121 is configured such that a PMOS transistor 50 and NMOS transistors 51 and 52 are connected in series between a power supply line VCCQ and ground, and NMOS transistors 60 to 63 are connected in parallel to the transistor 51. In this configuration, the transistors 51 and 60 to 63 constitute a variable load means. The output of the level shift & latch circuit 111 is provided to the gates of the transistors 50, 51 and 52. The outputs Q0 to Q3 (Q0 is LSB) of the counter 27 of FIG. 4 are provided to the gates of the transistors 60 to 63, respectively. The ratios of the gate widths of the transistors 60 to 63 are 1:2:4:8.

When the output of the level shift & latch circuit 111 is low, the transistors 50, 51 and 52 are on, off and off, respectively. For example, when the count of the counter 27 is 6, since Q0='0', Q1='1', Q2='1' and Q3='0,' the transistors 60 and 63 are both off and the transistors 61 and 62 are both on. When the output of the level shift & latch circuit 111 goes high from this state, the transistor 50 is turned off, while the transistors 51 and 52 are turned on. At this time, the positive charge on the output line of the fall phase variable inverter 121 flows through not only the transistor 51, but also the transistors 61 and 62 and further, through the transistor 52 down to ground. Therefore, as the count is larger, the output potential of the fall phase variable inverter 121 goes low at a higher speed.

Likewise, the rise phase variable inverter 122 is configured such that PMOS transistors 70 and 71 and an NMOS transistor 72 are connected in series between the power supply line VCCQ and ground, and PMOS transistors 80 to 83 are connected in parallel to the transistor 71. The output of the level shift & latch circuit 112 is provided to the gates of the transistors 70, 71 and 72. The outputs Q0 to Q3 of the counter 27 of FIG. 4 are provided to the gates of the transistors 80 to 83, respectively. The ratios of the gate widths of the transistors 80 to 83 are 1:2:4:8.

When the output of the level shift & latch circuit 112 is high, the transistors 70, 71 and 72 are off, off and on, respectively. For example, when Q0='0', Q1='1', Q2='1' and Q3='0' as in the above case, the transistors 80 and 83 are both on and the transistors 81 and 82 are both off. When the output of the level shift & latch circuit 112 goes low from this state, the transistors 70 and 71 are turned on and the transistor 72 is turned off. At this time, the positive charge passed through the transistor 70 from the power supply line VCCQ flows through not only the transistor 71, but also the transistors 80 and 83 to the output line. Therefore, as the count is smaller, the output potential of the rise phase variable inverter 122 goes high at a higher speed.

The output buffer circuit 13 comprises a PMOS transistor 131 connected between the power supply line VCCQ and the output line of the output data DO, and an NMOS transistor 132 connected between this output line and ground, wherein the outputs of the fall phase variable inverter 121 and the rise phase variable inverter 122 are provided to the gates of the transistors 131 and 132, respectively.

When the clock CLK goes high while the DATA is high, the outputs of the level shift & latch circuits 111, 112 go high, the outputs of the fall phase variable inverter 121 and rise phase variable inverter 122 go low, and the transistors 131 and 132 of the output buffer circuit 13 are turned on and off, respectively, so that the output data signal DO goes high. Therefore, as the count of the counter 27 is larger, the output data signal DO goes high at a higher speed.

Assume that next the clock CLK goes low, and thereafter, the DATA goes low and following this, the clock CLK goes high. Then the outputs of the level shift & latch circuits 111 and 112 go low, the outputs of the inverters 121 and 122 go high, and the transistors 131 and 132 of the output buffer circuit 13 are turned off and on, respectively, so that the output data signal DO goes low. Therefore, as the count of the counter 27 is smaller, the output data signal DO goes low at a higher speed.

From the above explanation, it is understood that as the count of the counter 27 is larger, not only does the phase on rising edge of the output data signal DO advance more, but the phase on falling edge of the output data signal DO lags more as well, while as the count of the counter 27 is smaller, not only does the phase on rising edge of the output data signal DO lags more, but the phase on falling edge of the output data signal DO advances more as well.

Of FIG. 4, the gate circuit 210, level shift & latch circuits 211 and 212, a fall phase variable inverter 221, a rise phase variable inverter 222, and the output buffer circuit 23 are uniformly scaled-down versions of the gate circuit 110, the level shift & latch circuits 111 and 112, the fall phase variable inverter 121, the rise phase variable inverter, and the output buffer circuit 13, respectively, of FIG. 5. Each constituent of the inverters 221 and 222 of FIG. 4 is denoted by a corresponding reference character of FIG. 5 attached with an additional character R. The output bits Q0 to Q4 of the counter 27 are provided to the gates of NMOS transistors 60R to 63R, respectively, and the gates of PMOS transistors 80R to 83R, respectively.

In FIG. 6, the load 14 is an equivalent circuit in a case where the output DO of the output buffer circuit 13 of FIG. 5 is connected to the data signal input of another chip having an SSTL interface, a stub resistor Rs and a terminal resistor Rt are connected in series between the output DDO of the output buffer circuit 13 and a terminal voltage Vtt, and a load capacitance CL is connected between a connection node of the resistors Rs and Rt, and ground. Here, Vref=Vtt=VCCQ/2 and, for example, VCCQ=2.5 V.

On the other hand, the dummy load 24 corresponding to the load 14 is a load capacitor. The low pass filter 25 is a CR integrator configured such that a resistor 251 and a capacitor 252 are connected in series between the output DDO of the output buffer circuit 23 of FIG. 4 and ground. A PMOS transistor 253 is used to reset the potential of the connection node between the resistor 251 and the capacitor 252 to the reference voltage Vref, and is connected between this connection node and the reference voltage Vref, and a reset signal *RST is provided to the gate of the PMOS transistor 253.

The comparator 26 is constructed of a differential latch comparator 261 and a gate circuit 262.

The comparator 261 comprises NMOS transistors 90 to 94 and PMOS transistors 95 to 98, wherein the output Vm of the low pass filter 25 and the reference voltage Vref are provided to the gates of the transistors 91 and 92, respectively, and an enable signal EN is provided to the gates of the transistors 90, 95 and 98. The transistors 93, 94, 96 and 97 constitute a flip-flop for amplifying and holding its input. The complementary outputs of the differential latch comparator 261 are the drains of the transistors 96 and 97, and the outputs are provided to first ends of AND gates 102 and 103 through inverters 100 and 101, respectively, of the gate circuit 262. The enable signal EN is provided to the second inputs of the AND gates 102 and 103.

When the enable signal EN is low, the transistor 90 is in an off state, and thereby decreasing useless power consumption. Further the transistors 95 and 98 are on, the potentials of the drains and the gates of the transistor 93, 94, 96 and 97 are almost equal to the VCCQ, and the transistors 93 and 94 are on, while the transistors 96 and 97 are off, so that the flip-flop is in an inactive state. Furthermore, both the outputs of the AND gates 102 and 103 are low, and thereby the count of the counter 27 is fixed. A reset signal *RST is provided to the load input LD of the counter 27.

It is not necessary to perform adjustment of the rise phase variable inverter 221 and the fall phase variable inverter 222 all the time, and therefore the enable signal EN is set high every fourth cycle for example. When the enable signal EN is high, the PMOS transistors 95 and 98 are off to put the flip-flop into an active state.

Then, operations in the circuitry of FIGS. 4 to 6 configured as described above will be described below.

In response to a negative pulse of the reset signal *RST such a time when power is turned on, the PMOS transistor 253 is temporarily turned on, and thereby the average voltage Vm is reset to the reference voltage Vref. With this resetting, a charging time of the capacitor 251 through the resistor 251 is made shorter, thereby speeding up an initial response in a feed back control. Further, an initial value is loaded on the counter 27 to reset the count to zero in response to the reset signal *RST.

When Vm<Vref, since the resistance value of the transistor 91 is larger than that of the transistor 92, the drain potential of the transistor 91 becomes higher than that of the transistor 92, and the drain potential of the transistor 93 becomes higher than that of the transistor 94. The drain potential difference between the transistors 93 and 94 is amplified by the flip-flop, and thereby the transistors 96 and 94 are turned on while the transistors 97 and 93 are turned off, so that the outputs of the inverters 100 and 101 go low and high, respectively, and the outputs of the AND gates 102 and 103 go low and high, respectively. Thereby the count of the counter 27 is incremented. By means of the delay circuit 15, the outputs of the level shift & latch circuits 211 and 212 change after the count of the counter 17 has become stable. It should be noted that if the outputs of the level shift & latch circuits 211 and 212 and the count of the counter 27 change at the same time, the output of the circuit 26 or 27 is properly delayed in design phase to avoid this phenomenon. With increase in the count, the rising edges of the dummy data signal DDO and the output data signal DO become earlier together with the falling edges thereof being delayed, whereby the average voltage Vm rises.

When Vm>Vref, operation reverse to the above-described case is performed.

In such a manner, the high and low level duration of the dummy output data signal DDO become almost equal to each other independently of variations in fabrication process, temperature and power supply voltage of the semiconductor device, so that it is prevented from occurring that an indefinite-data signal time B of the output data signal DO is longer due to these variations. Therefore, the clock CLK can be faster.

Figure 7:
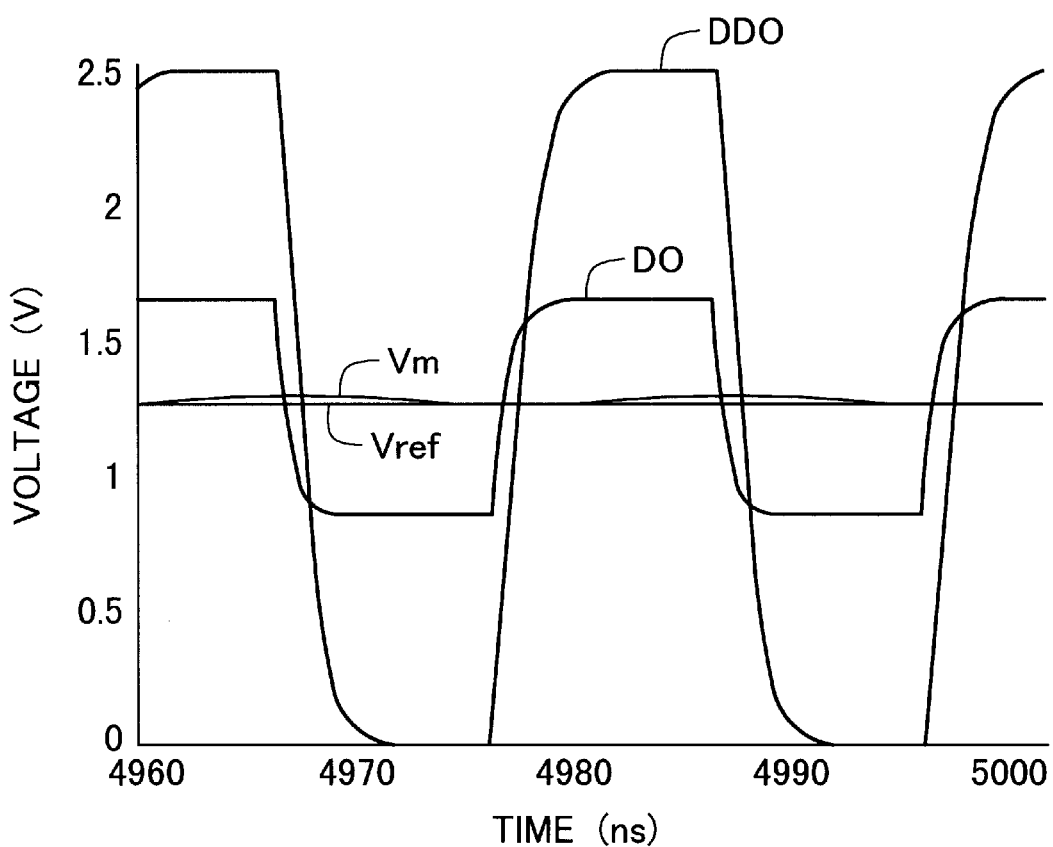
FIG. 7 is a simulated waveform diagram showing the output data signal DO and the dummy output data signal DDO.
Figure 8:
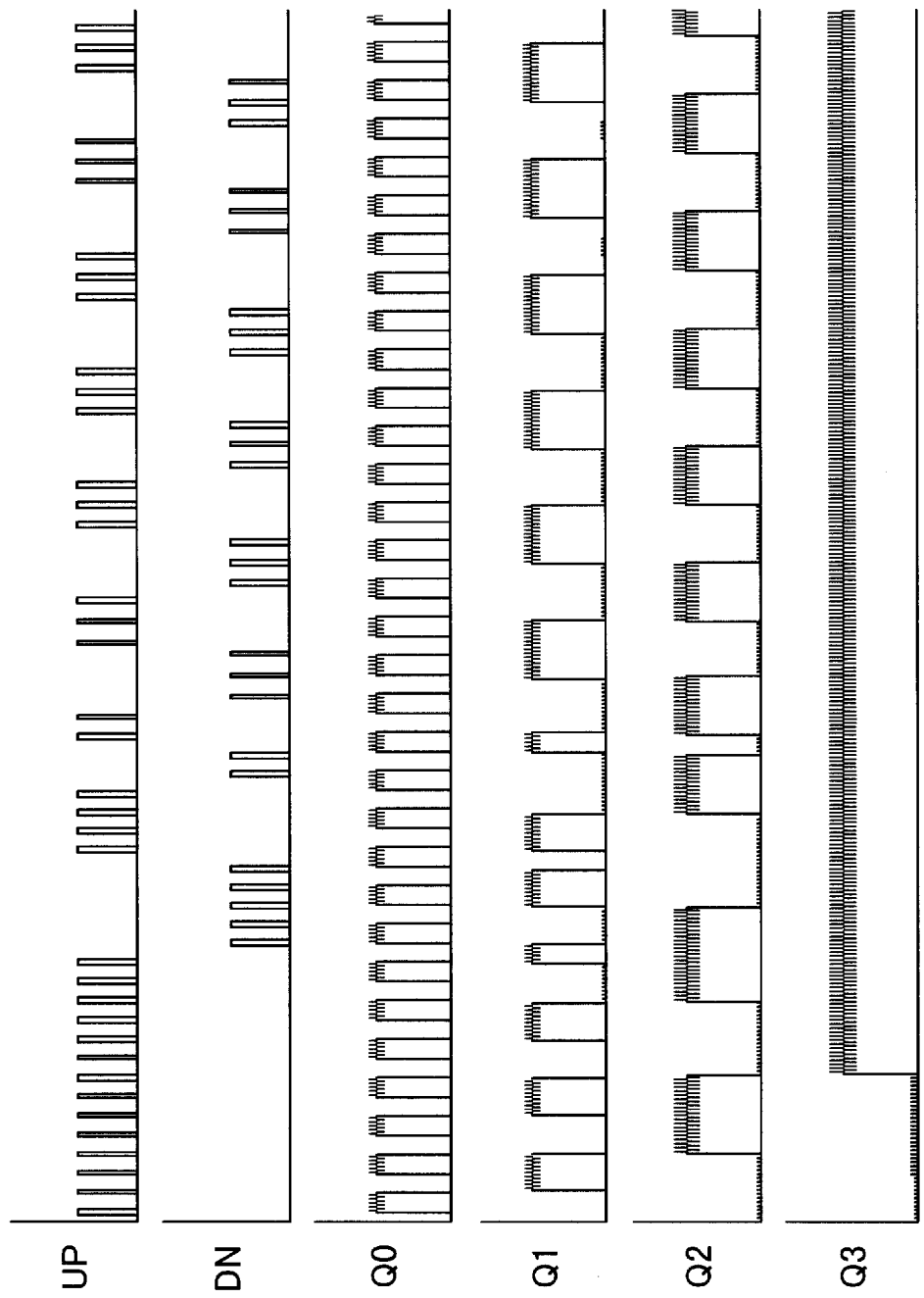
FIG. 8 is simulated waveform diagram showing a count-up signal, a count-down signal and counter output signals.
Figure 9:
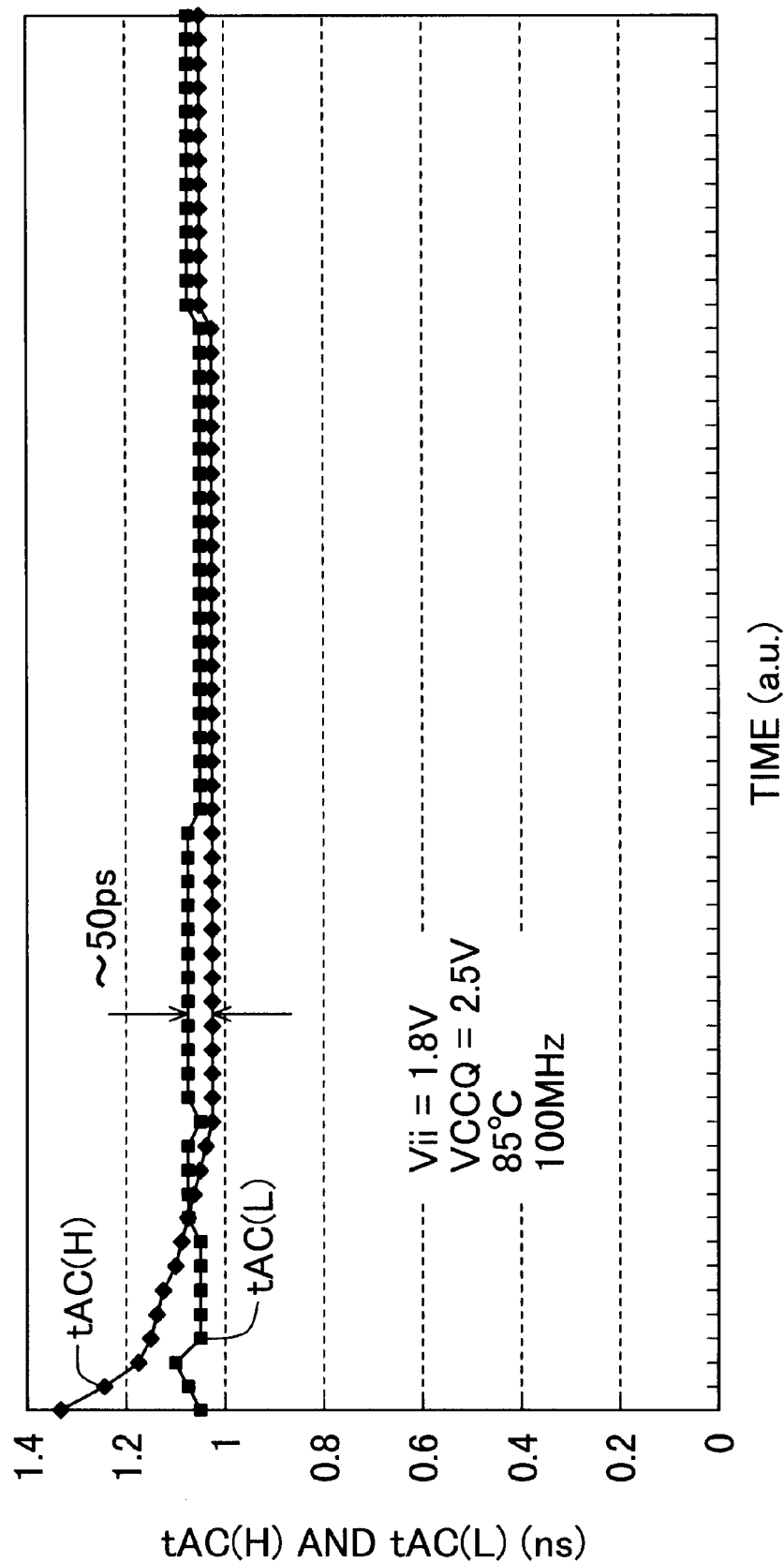
FIG. 9 is a simulated diagram showing changes in high level duration tAC (H) and low level duration tAC(L) of the output data signal DO when the data signal DO is inverted in each clock cycle.
Figure 10:
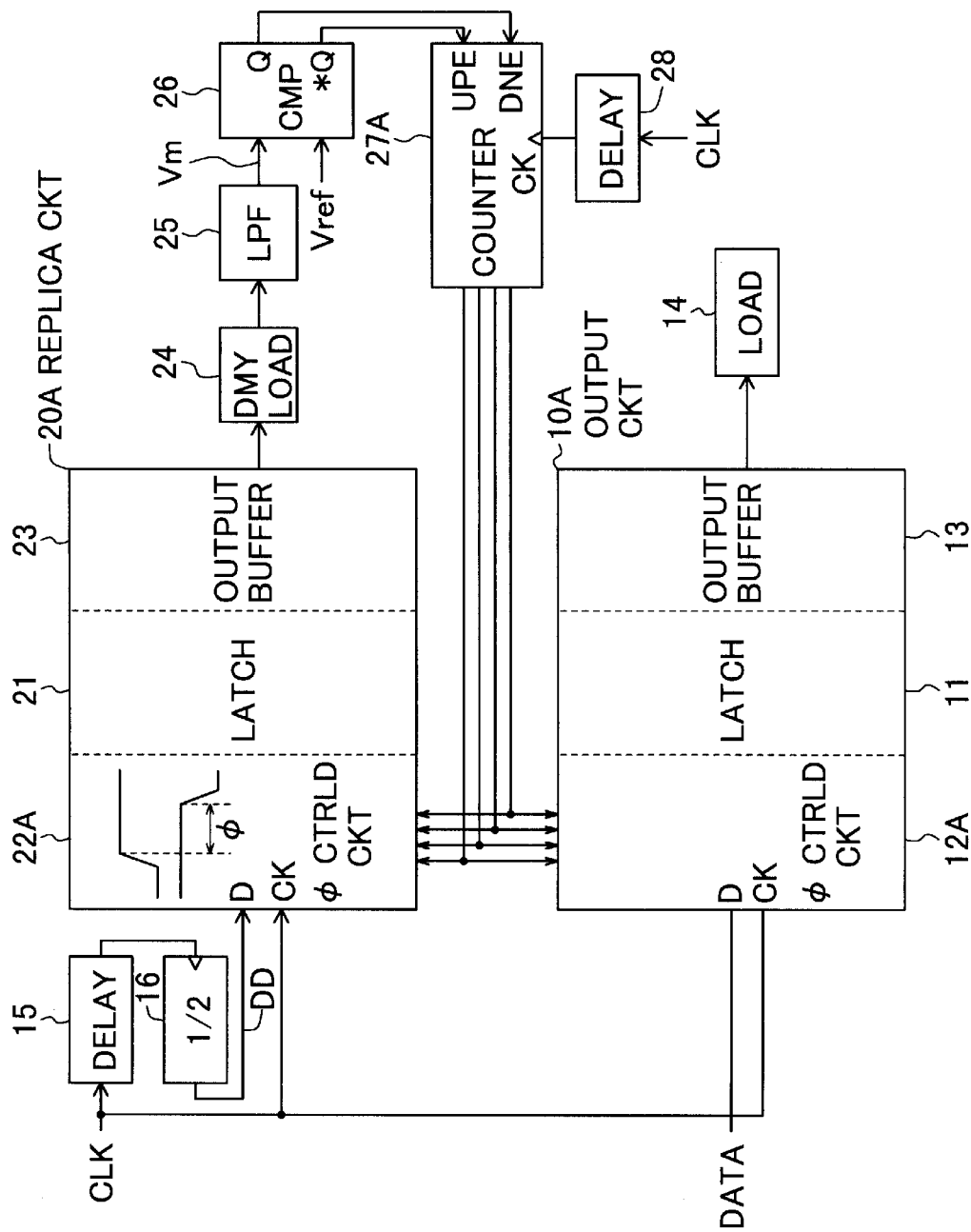
FIG. 10 is a schematic circuit diagram showing configurations of an output circuit and a circuit for automatically decreasing the phase difference between rising and falling edges of the output data signal of the output circuit built in a semiconductor device, of a second embodiment according to the present invention.
Figure 11A:
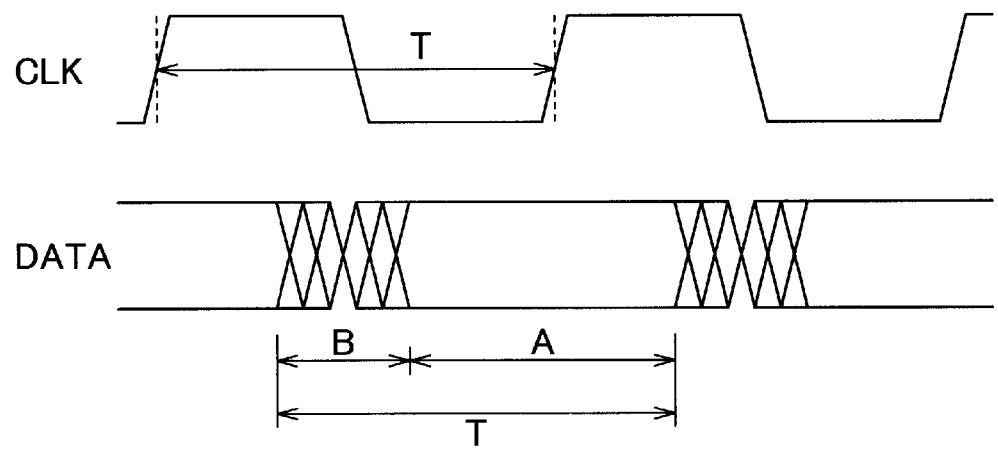
FIGS. 11(A) and 11(B) are time charts each showing relations between a data signal outputted from the output circuit and a clock.
Figure 11B:
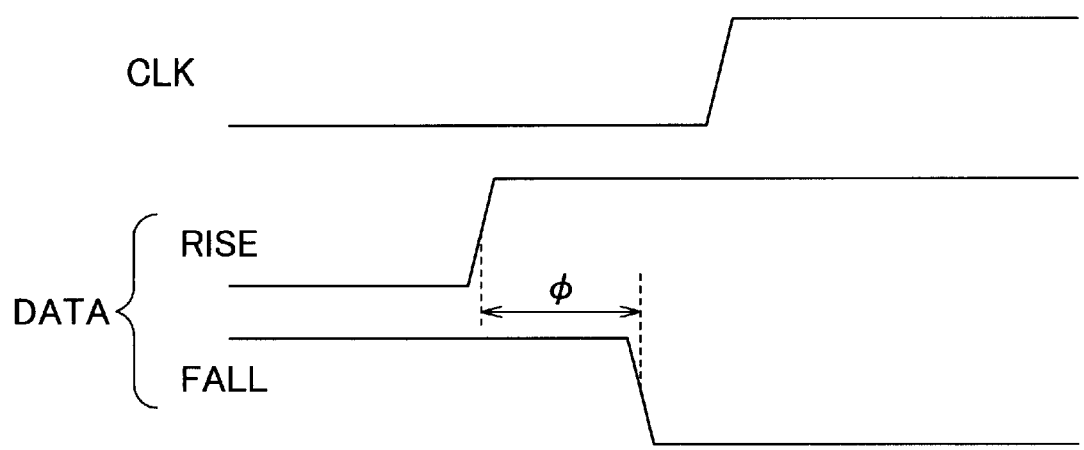

FIGS. 7 to 9 show simulation results of the combination of the circuits of FIGS. 4 to 6, wherein conditions of the simulation were that the frequency of the clock CLK is 100 MHZ; a temperature of a semiconductor device is at 85° C.; VCCQ=2.5, and Vii=1.8 V.

FIG. 7 shows simulated waveforms of the output data signal DO and the dummy output data signal DDO, FIG. 8 shows simulated waveforms of the count-up signal UP, the count-down signal DN and the three bits Q1 to Q3 of the count, and FIG. 9 shows changes in the high level duration tAC (H) and the low level duration tAC(L) of the output data signal DO when the DATA signal is inverted every cycle of the clock CLK.

It is clear from FIG. 9 that the difference between 'H' and 'L' duration can be decreased less than about 50 ps using the above-described first embodiment. Contrast to this, the difference in the prior art was on the order of 200 ps.

Second Embodiment

FIG. 1 shows schematic configurations of an output circuit 10A and a circuit for automatically decreasing the phase difference between rising and falling edges of the output data signal of the output circuit 10A in a semiconductor device, of the second embodiment according to the present invention.

In the output circuit 10A, a phase difference controlled circuit 12A is placed before the latch circuit 11, a data signal whose phase difference have been controlled is held in the latch circuit 11, and the value thereof is outputted through the output buffer circuit 13. Likewise, in a replica circuit 20A, a phase difference controlled circuit 22A is placed before the latch circuit 21 in a corresponding manner to the output circuit 10A.

Further, a counter 27A counts up pulses provided to the clock input CK during an up-enable signal input UPE is high, while the counter 27A counts down pulses provided to the clock input CK during a down-enable signal input DNE is high. The outputs *Q and Q of the comparator 26 are provided to the inputs UPE and DNE of the counter 27A. The clock CLK is provided to the clock input CK of the counter 27A through a delay circuit 28. The delay time of the delay circuit 28 is determined in design phase in such a way that the input of the phase difference controlled circuit 22 changes after the count of the counter 27A has been stable.

The other points in configuration are the same as those of FIG. 1.

According to the second embodiment as well, the same effect as that of the first embodiment can be obtained.

Although preferred embodiments of the present invention has been described, it is to be understood that the invention is not limited thereto and that various changes and modifications may be made without departing from the spirit and scope of the invention.

For example, an A/D converter may be employed as a control circuit instead of the comparator 26 and the counter 27. Further, the level shift circuits are not required to be included in the output circuit 10 or 10A and its replica circuit 20 or 20A.

What is claimed is:

1. A semiconductor device comprising:

an output circuit, having a clock input to receive a clock, having a data input to receive an input data, having a data output providing said input data as an output data in response to said clock, having a control input to receive a control signal for adjusting an output timing of said output data;

a replica circuit of said output circuit, having a clock input to receive said clock, having a data input to receive a cyclically inverted input dummy data, said input dummy data being in synchronism with said clock, having a data output providing said dummy data as an output dummy data in response to said clock, having a control input to receive said control signal for adjusting an output timing of said output dummy data;

a dummy load circuit, receiving said output dummy data; and a control circuit, providing said control signal to make high and low level duration of said output dummy data provided from said dummy load circuit become equal to each other.

2. The semiconductor device of claim 1, wherein said control circuit comprises:

a smoothing circuit, smoothing said output dummy data provided from said dummy load circuit;

a comparator circuit, comparing an output of said smoothing circuit with a reference value; and an up-down counter, counting up or down according to a comparison result of said comparator, providing its count as said control signal.

3. The semiconductor device of claim 1, wherein said output circuit comprises:

a latch circuit, latching said input data as a latched data in response to said clock;

a phase difference controlled circuit, receiving said latched data, changing a phase of a rising or a falling edge of said latched data relative to said clock in response to said control signal; and an output buffer circuit, receiving an output of said phase difference controlled circuit to provide said output data.

4. The semiconductor device of claim 1, wherein said output circuit comprises:

a phase difference controlled circuit, receiving said input data, changing a phase of a rising or a falling edge of said input data relative to said clock in response to said control signal; and a latch circuit, latching an output of said phase difference controlled circuit as a latched data in response to said clock; and an output buffer circuit, receiving said latched data to provide said output data.

5. The semiconductor device of claim 3, wherein said phase difference controlled circuit comprises:

a CMOS inverter, having a first transistor, having a second transistor connected in series to said first transistor, each of said first and second transistors having a gate to receive said latched data; and a plurality of transistors, connected in parallel to either said first or second transistor, gates thereof receiving respective bits of said control signal.

6. The semiconductor device of claim 4, wherein said phase difference controlled circuit comprises:

a CMOS inverter, having a first transistor, having a second transistor connected in series to said first transistor, each of said first and second transistors having a gate to receive said input data; and a plurality of transistors, connected in parallel to either said first or second transistor, gates thereof receiving respective bits of said control signal.

7. The semiconductor device of claim 1, wherein said output circuit comprises:

a latch circuit, latching said input data as a latched data in response to said clock;

a phase difference controlled circuit, receiving said latched data, changing both phases of a rising edge of said latched data relative to said clock in one direction on time-axis and a falling edge of said latched data relative to said clock in the opposite direction on time-axis in response to said control signal; and an output buffer circuit, receiving an output of said phase difference controlled circuit to provide said output data.

8. The semiconductor device of claim 7, wherein said phase difference controlled circuit comprises:

a first CMOS inverter, having a first transistor, having a second transistor connected in series to said first transistor, each of said first and second transistors having a gat to receive said latched data;

a second CMOS inverter, having a first transistor, having a second transistor connected in series to said first transistor thereof, each of said first and second transistors thereof having a gate to receive said latched data;

a plurality of first transistors, connected in parallel to said first transistor of said first CMOS inverter, gates thereof receiving respective bits of said control signal;

a plurality of second transistors, connected in parallel to said second transistor of said second CMOS inverter, gates thereof receiving respective bits of said control signal.

9. The semiconductor device of claim 7, wherein said output buffer circuit is a push-pull circuit, having a push transistor, having a pull transistor connected in series to said push transistor, wherein said push transistor has a gate connected to an output of said first CMOS inverter, and said pull transistor has a gate connected to an output of said second CMOS inverter.

10. The semiconductor device of claim 1, wherein said output circuit comprises:

a phase difference controlled circuit, receiving said input data, changing both phases of a rising edge of said input data relative to said clock in one direction on time-axis and a falling edge of said input data relative to said clock in the opposite direction on time-axis in response to said control signal;

a latch circuit, latching an output of said phase difference controlled circuit as a latched data in response to said clock; and an output buffer circuit, receiving said latched data to provide said output data.

11. The semiconductor device of claim 10, wherein said phase difference controlled circuit comprises:

a first CMOS inverter, having a first transistor, having a second transistor connected in series to said first transistor, each of said first and second transistors having a gat to receive said input data;

a second CMOS inverter, having a first transistor, having a second transistor connected in series to said first transistor thereof, each of said first and second transistors thereof having a gate to receive said input data;

a plurality of first transistors, connected in parallel to said first transistor of said first CMOS inverter, gates thereof receiving respective bits of said control signal;

a plurality of second transistors, connected in parallel to said second transistor of said second CMOS inverter, gates thereof receiving respective bits of said control signal.

12. The semiconductor device of claim 11, wherein said output buffer circuit is a push-pull circuit, having a push transistor, having a pull transistor connected in series to said push transistor, wherein said push transistor has a gate connected to an output of said first CMOS inverter, and said pull transistor has a gate connected to an output of said second CMOS inverter.

* * * * *